(12) United States Patent
Huang et al.

(10) Patent No.: US 8,288,847 B2
(45) Date of Patent: Oct. 16, 2012

(54) DUAL DIE SEMICONDUCTOR PACKAGE

(75) Inventors: Meiquan Huang, Tianjin (CN); Hejin Liu, Tianjin (CN); Wenjian Xu, Tianjin (CN); Dehong Ye, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 108 days.

(21) Appl. No.: 12/830,446

(22) Filed: Jul. 6, 2010

(65) Prior Publication Data

US 2011/0175212 A1   Jul. 21, 2011

(51) Int. Cl.
*H01L 23/02* (2006.01)

(52) U.S. Cl. ......... 257/676; 257/675; 257/723; 257/686

(58) Field of Classification Search .......... 257/666–676, 257/690, 784, E23.031
See application file for complete search history.

(56) References Cited

U.S. PATENT DOCUMENTS

| | | | |
|---|---|---|---|
| 5,012,323 A | 4/1991 | Farnworth | |
| 5,239,198 A | 8/1993 | Lin | |
| 5,508,556 A | 4/1996 | Lin | |
| 5,541,450 A | 7/1996 | Jones | |
| 5,563,446 A | 10/1996 | Chia | |
| 5,608,262 A | 3/1997 | Degani | |
| 6,077,724 A * | 6/2000 | Chen | 438/107 |
| 6,249,052 B1 | 6/2001 | Lin | |
| 6,261,869 B1 | 7/2001 | Radford | |
| 6,307,257 B1 | 10/2001 | Huang | |
| 6,407,456 B1 | 6/2002 | Ball | |
| 6,426,559 B1 | 7/2002 | Bryan | |
| 6,437,447 B1 | 8/2002 | Huang | |
| 6,590,281 B2 | 7/2003 | Wu | |
| 6,815,829 B2 | 11/2004 | Shibata | |
| 7,242,101 B2 * | 7/2007 | Ararao et al. | 257/784 |
| 7,554,185 B2 | 6/2009 | Foong | |
| 7,872,335 B2 * | 1/2011 | Khan et al. | 257/666 |
| 7,969,009 B2 * | 6/2011 | Chandrasekaran | 257/758 |
| 8,022,522 B1 * | 9/2011 | Liou et al. | 257/686 |
| 2003/0053297 A1 | 3/2003 | Gaynes | |
| 2004/0212068 A1 | 10/2004 | Wang | |
| 2004/0217485 A1 | 11/2004 | Chung | |
| 2004/0251531 A1 | 12/2004 | Yang | |
| 2011/0215454 A1 * | 9/2011 | Wang | 257/676 |

* cited by examiner

*Primary Examiner* — Steven Loke
*Assistant Examiner* — David Goodwin
(74) *Attorney, Agent, or Firm* — Charles Bergere

(57) ABSTRACT

A dual die semiconductor package has a grid array of electrical contacts on a bottom surface of a substrate. There is a first semiconductor die with a base surface mounted to an upper surface of the substrate and the first semiconductor die has first die upper surface external electrical connection pads on an upper surface that are electrically connected to respective electrical contacts of the grid array. There is also a second semiconductor die with a base surface mounted to an upper surface of a lead frame flag. There are second die upper surface external electrical connection pads on an upper surface of the second semiconductor die. The dual die semiconductor package includes leads and at least some of the leads are electrically connected to respective pads that provide the second die upper surface external electrical connection pads. A package body at encloses the first semiconductor die and the second semiconductor die. The electrical contacts of the grid array and part of each of the leads protrude from the package body to form external package electrical connections. Also, at least part of a base surface of the lead frame flag directly under the second semiconductor die is left exposed by the package body and provides a heat sink.

11 Claims, 4 Drawing Sheets

DUAL DIE SEMICONDUCTOR PACKAGE

BACKGROUND OF THE INVENTION

The present invention relates to a dual die semiconductor package with an exposed base surface of a lead frame flag. More specifically, the present invention relates to a dual die semiconductor package with an exposed base surface of a lead frame flag and external connections provided by both a grid array and leads.

Semiconductor packages are becoming more complex and a single package can include one or more semiconductor dies that have high processing power. As a result, there is a need for more external connections for each die and in particular the provision of sufficient ground plane connections may be problematic. Furthermore, the increased complexity of semiconductor dice causes undesirable heat generation that must be dissipated by the semiconductor package.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
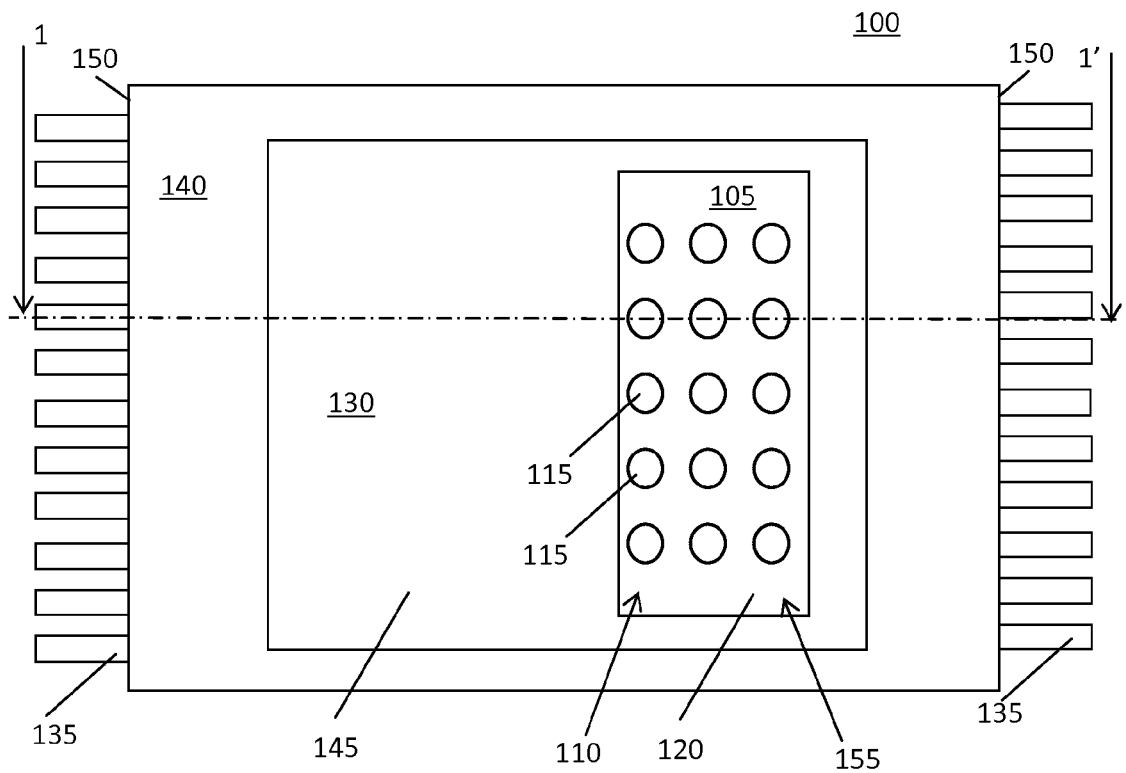
FIG. 1 is a bottom plan view of a dual die semiconductor package in accordance with an embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that package, circuit, device components and method steps that comprises a list of elements or steps does not include only those elements but may include other elements or steps not expressly listed or inherent to such package, circuit, device components or steps. An element or step proceeded by "comprises . . . a" does not, without more constraints, preclude the existence of additional identical elements or steps that comprises the element or step.

In one embodiment, the present invention provides a dual die semiconductor package having a substrate with a grid array of electrical contacts on a bottom surface of the substrate. There is a first semiconductor die with a base surface mounted to an upper surface of the substrate, the first semiconductor die has a plurality of first die upper surface external electrical connection pads on an upper surface thereof that are electrically connected to respective electrical contacts of the grid array. There is also a second semiconductor die with a base surface mounted to an upper surface of a lead frame flag. There are second die upper surface external electrical connection pads on an upper surface of the second semiconductor die. The dual die semiconductor package includes a plurality of leads, at least some of the leads are electrically connected to respective pads that provide the second die upper surface external electrical connection pads. A package body at least partially encloses the first semiconductor die and the second semiconductor die. The electrical contacts of the grid array and part of each of the leads protrude from the package body to form external package electrical connections, and at least part of a base surface of the lead frame flag is left exposed by the package body.

In another embodiment, the present invention provides dual die semiconductor package having a substrate with a grid array of electrical contacts on a bottom surface of the substrate. There is a first semiconductor die with a base surface mounted to an upper surface of the substrate, the first semiconductor die has a plurality of first die upper surface external electrical connection pads on an upper surface thereof that are electrically connected to respective electrical contacts of the grid array. There is also a second semiconductor die with a base surface mounted to an upper surface of a lead frame flag. There are second die upper surface external electrical connection pads on an upper surface of the second semiconductor die. The dual die semiconductor package includes a plurality of leads, at least some of the leads are electrically connected to respective pads that provide the second die upper surface external electrical connection pads. A package body at least partially encloses the first semiconductor die and the second semiconductor die. The electrical contacts of the grid array and part of each of the leads protrude from the package body to form external package electrical connections. Also, at least part of a base surface of the lead frame flag directly under the second semiconductor die is left exposed by the package body and provides a heat sink.

Figure 2:
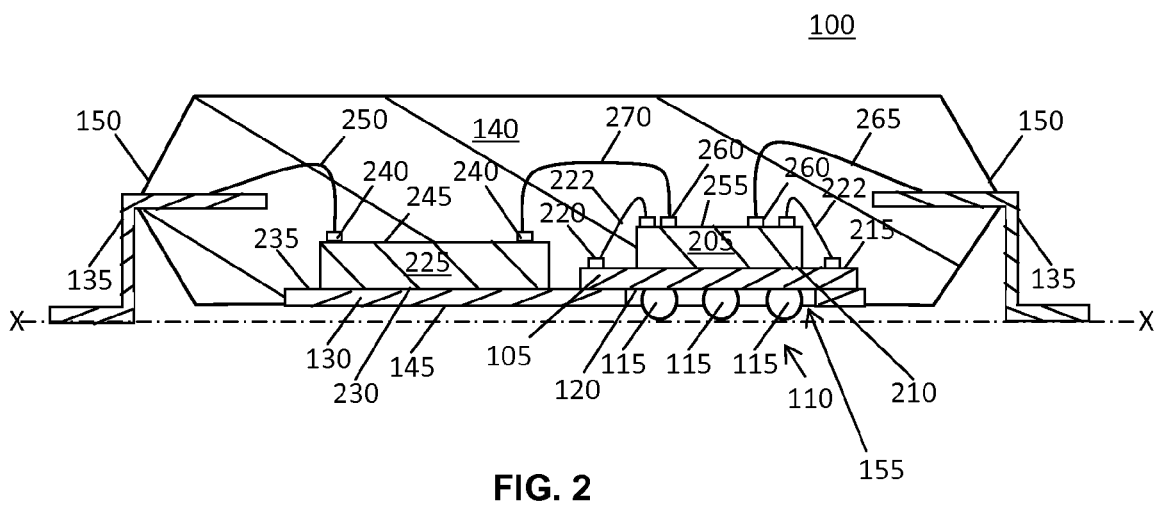
FIG. 2 is a cross-sectional side view through 1-1' of the dual die semiconductor package of FIG. 1.

Referring to FIG. 1 and FIG. 2 there is illustrated a dual die semiconductor package 100 in accordance with an embodiment of the present invention. The dual die semiconductor package 100 has a substrate 105 with a grid array 110 of electrical contacts 115 on a bottom surface 120 of the substrate 105. In this embodiment, the grid array 110 is a ball grid array and there is a first semiconductor die 205 with a base surface 210 mounted to an upper surface 215 of the substrate 105. The mounting of the first semiconductor die 205 to the upper surface 215 of the substrate 105, is typically secured by an epoxy resin or any other suitable bonding substance or adhesive. The first semiconductor die 205 has a plurality of first die upper surface external electrical connection pads 260 on an upper surface 255, and some of the upper surface external electrical connection pads 260 are electrically connected to respective electrical contacts 115 of the grid array 110. The first die upper surface external electrical connection pads 260 are electrically coupled to pads 220 on the substrate 105 by bonded wires 222. Typically the pads 220 on the substrate 105 are coupled by runners to conductive vias in the substrate (not illustrated) that are attached to the electrical contacts 115 by solder as is well known in the art.

The dual die semiconductor package 100 includes a second semiconductor die 225 with a base surface 230 mounted to an upper surface 235 of a lead frame flag 130. This mounting of the second semiconductor die 225 to the upper surface 235 of the lead frame flag 130 is typically provided by a conductive glue or other suitable bonding substance. The second semiconductor die 225 has second die upper surface external electrical connection pads 240 on an upper surface 245 of the second semiconductor die 225. There is also a plurality of leads 135 and at least some of the leads 135 are electrically connected to their respective second die upper surface external electrical connection pads 240 by bonded wires 250. It will be understood that the leads 135 and the lead frame flag 130 were originally part of a lead frame that was singulated during manufacture of the dual die semiconductor package 100.

There is a package body 140 that at least partially encloses the first semiconductor die 205 and the second semiconductor die 225. The electrical contacts 115 of the grid array 110 and part of each of the leads 135 protrude from the package body 140 to form external package electrical connections. Furthermore, least part of a base surface 145 of the lead frame flag 130 that is directly under the second semiconductor die 225 is left exposed by the package body 140.

As illustrated, the part of each of the leads 135 that protrude from the package body 140 extend from edges 150 of the package body 140. Furthermore, the leads 135 extend from two opposite edges 150, however, the leads could extend from all four edges of the package body 140. Also, the part of each of the leads 135 that protrude from the package body 140 are bend and thus are configured to form a seating plane X. Also, the electrical contacts 115 of the grid array 110 are aligned in the seating plane X and the grid array 110 is aligned directly under the first semiconductor die 205.

If required, some of the first die upper surface external electrical connection pads 260 can be electrically connected to respective leads 135 by bonded wires 265. Also, some of the first die upper surface external electrical connection pads 260 are electrically connected respectively, by bonded wires 270, to selected pads from the second die upper surface external electrical connection pads 240.

In this embodiment, the substrate 105 is mounted to an upper surface 235 of the lead frame flag 130 and the lead frame flag 130 has a slot 155 for allowing the electrical contacts 115 of the grid array 110 to pass through the slot and extend outside of the package body.

Figure 3:
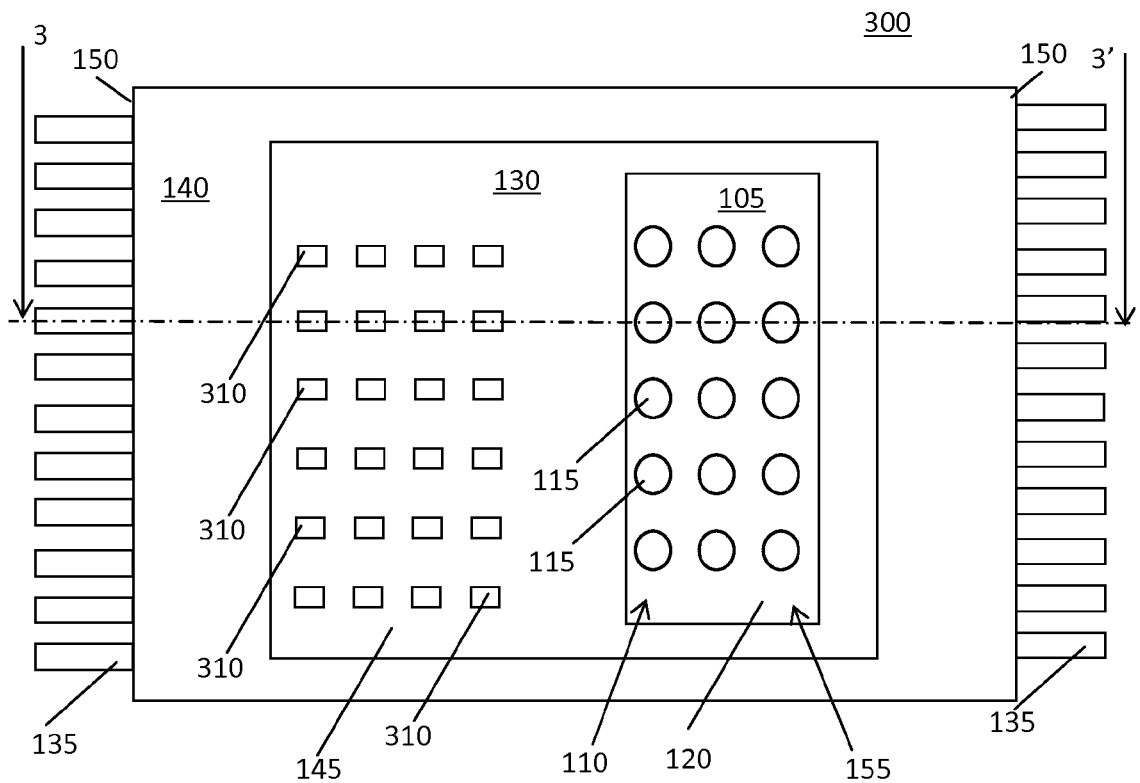
FIG. 3 is a bottom plan view of a dual die semiconductor package in accordance with another embodiment of the present invention.
Figure 4:
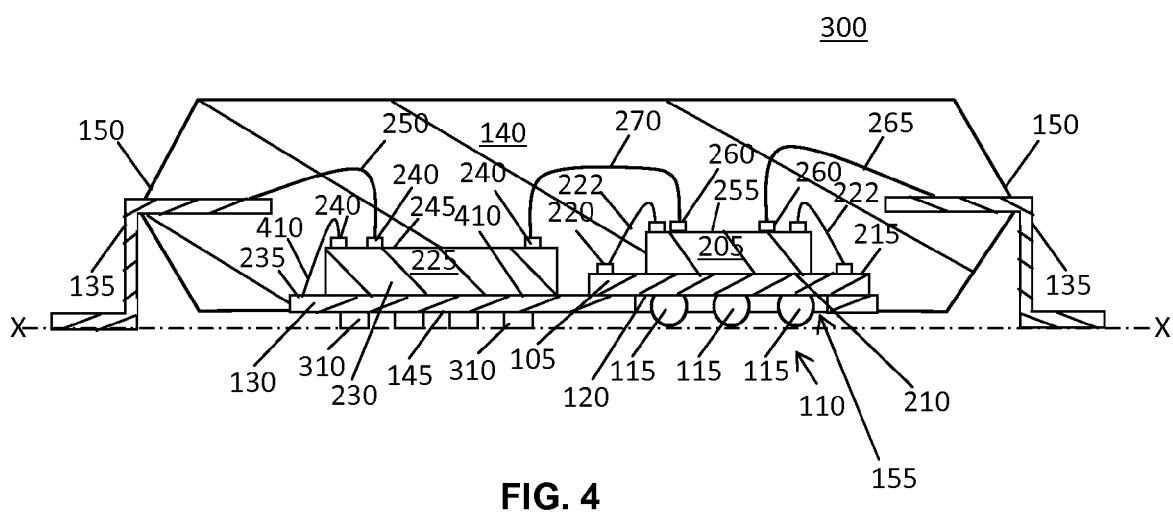
FIG. 4 is a cross-sectional side view through 3-3' of the dual die semiconductor package of FIG. 3.

Referring to FIG. 3 and FIG. 4 there is illustrated a dual die semiconductor package 300 in accordance with another embodiment of the present invention. To avoid repetition, since most of the elements or components of the dual die semiconductor package 300 are the same as that of the dual die semiconductor package 100, only the differences will be described. In this embodiment some of the second die upper surface external electrical connection pads 240 are electrically connected to the lead frame flag 130. The electrical connection of the second die upper surface external electrical connection pads 240 to the lead frame flag 130 is provided by bonded wires 410. There are electrical contacts 310 soldered on the base surface 145 of the lead frame flag 130, these electrical contacts 310 are aligned in the seating plane X and provide ground plane connections to the dual die semiconductor package 300. Although numerous electrical contacts 310 are illustrated, it is envisaged that as an alternative one single large electrical contact 310 could be used as will be apparent to a person skilled in the art.

Figure 5:
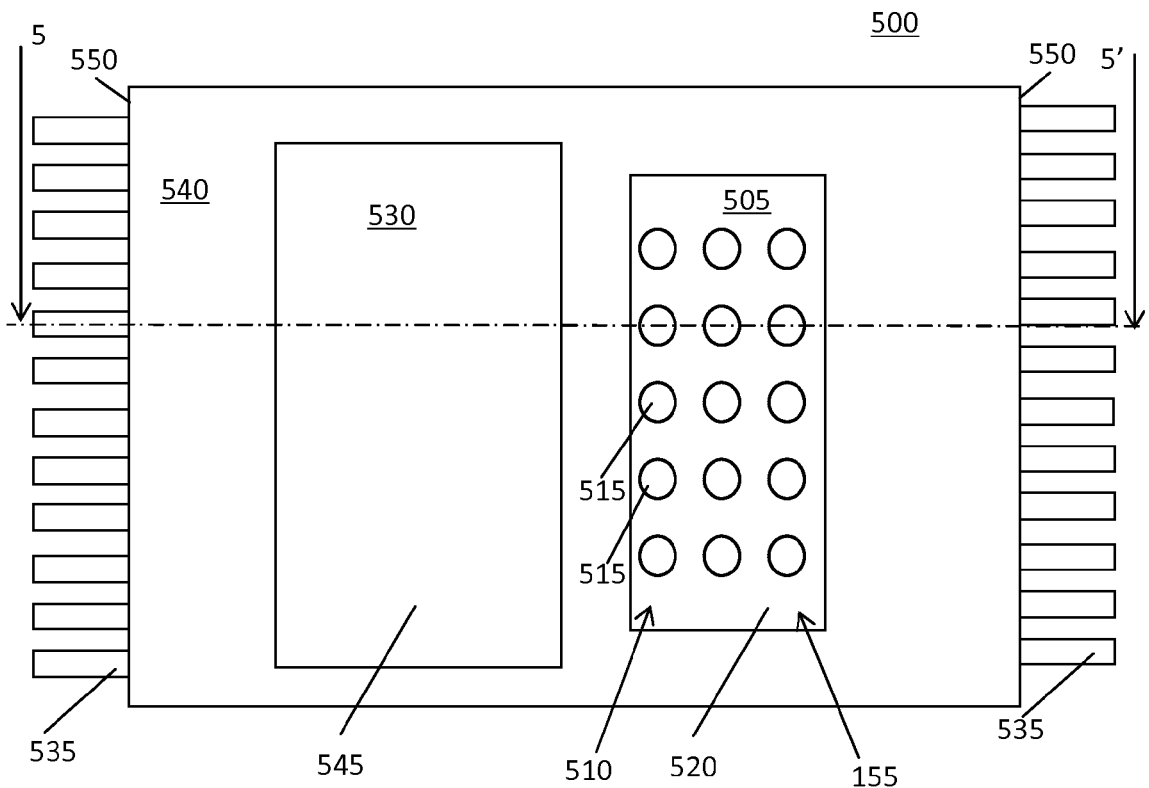
FIG. 5 is a bottom plan view of a dual die semiconductor package in accordance with a further embodiment of the present invention.
Figure 6:
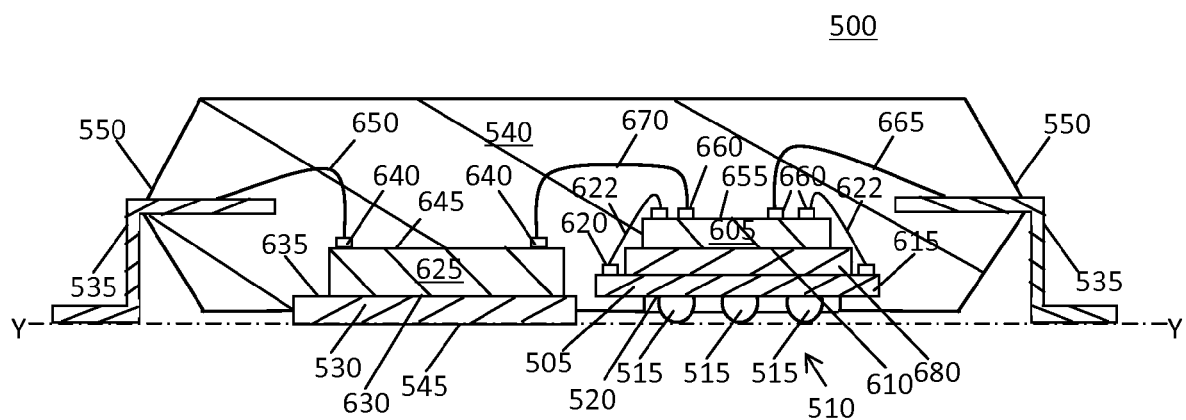
FIG. 6 is a cross-sectional side view through 5-5' of the dual die semiconductor package of FIG. 5.

Referring to FIG. 5 and FIG. 6 there is illustrated a dual die semiconductor package 500 in accordance with a further embodiment of the present invention. The dual die semiconductor package 500 has a substrate 505 with a grid array 510 of electrical contacts 515 on a bottom surface 520 of the substrate 505. In this embodiment, the grid array 510 is a ball grid array and there is a first semiconductor die 605 with a base surface 610 indirectly mounted to an upper surface 615 of the substrate 505 by an interposing flag that is described in more detail later in this specification. Again, the mounting of the first semiconductor die 605 to the upper surface 615 of the substrate 505, is typically secured by an epoxy resin or any other suitable bonding substance or adhesive. The first semiconductor die 605 has a plurality of first die upper surface external electrical connection pads 660 on an upper surface 655, some of the first die upper surface external electrical connection pads 660 are electrically connected to respective electrical contacts 515 of the grid array 510. The first die upper surface external electrical connection pads 660 are electrically coupled to pads 620 on the substrate 505 by bonded wires 622. Typically the pads 620 on the substrate 505 are coupled by runners to conductive vias in the substrate (not illustrated) that are attached to the electrical contacts 515 by solder as is well known in the art.

The dual die semiconductor package 500 includes a second semiconductor die 625 with a base surface 630 mounted to an upper surface 635 of a lead frame flag 530. This mounting of the second semiconductor die 225 to the upper surface 535 of the lead frame flag 530 is typically provided by conductive glue or solder paste. The second semiconductor die 625 has second die upper surface external electrical connection pads 640 on an upper surface 645 of the second semiconductor die 625. There is also a plurality of leads 535 and at least some of the leads 535 are electrically connected to their respective second die upper surface external electrical connection pads 640 by bonded wires 650. It will be understood that the leads 535 and the lead frame flag 530 were originally part of a lead frame that was singulated during manufacture of the dual die semiconductor package 500.

There is a package body 540 that at least partially encloses the first semiconductor die 605 and the second semiconductor die 625. The electrical contacts 515 of the grid array 510 and part of each of the leads 535 protrude from the package body 540 to form external package electrical connections. Furthermore, least part of a base surface 545 of the lead frame flag 530 that is directly under the second semiconductor die 625 is left exposed by the package body 540.

As illustrated, the part of each of the leads 535 that protrude from the package body 540 extend from edges 550 of the package body 540. As shown, the leads 535 extend from two opposite edges 550, however, the leads could extend from all four edges of the package body 540. Also, the part of each of the leads 535 that protrude from the package body 540 are bend and thus are configured to form a seating plane Y. Also, the electrical contacts 515 of the grid array 510, and the base surface 545 of the lead frame flag 530, are aligned in the seating plane Y and the grid array 510 is aligned directly under the first semiconductor die 605.

If required, some of the first die upper surface external electrical connection pads 660 can be electrically connected to respective leads 535 by bonded wires 665. Also, some of the first die upper surface external electrical connection pads 660 are electrically connected respectively, by bonded wires 670, to selected pads from the second die upper surface external electrical connection pads 640.

In this embodiment, the lead frame flag 530 is a first lead frame flag and there is a second lead frame flag 680 that is interposed between the base surface of the first semiconductor die 605 and the upper surface of the substrate 615. It will therefore be apparent to a person skilled in the art that the mounting of the first semiconductor die 605 to the upper surface 615 of the substrate 505 is provided by the interposing second lead frame flag 680. In this regard, the second lead frame flag 680 and has an epoxy resin or any other suitable bonding substance or adhesive applied to both of its surfaces.

Figure 7:
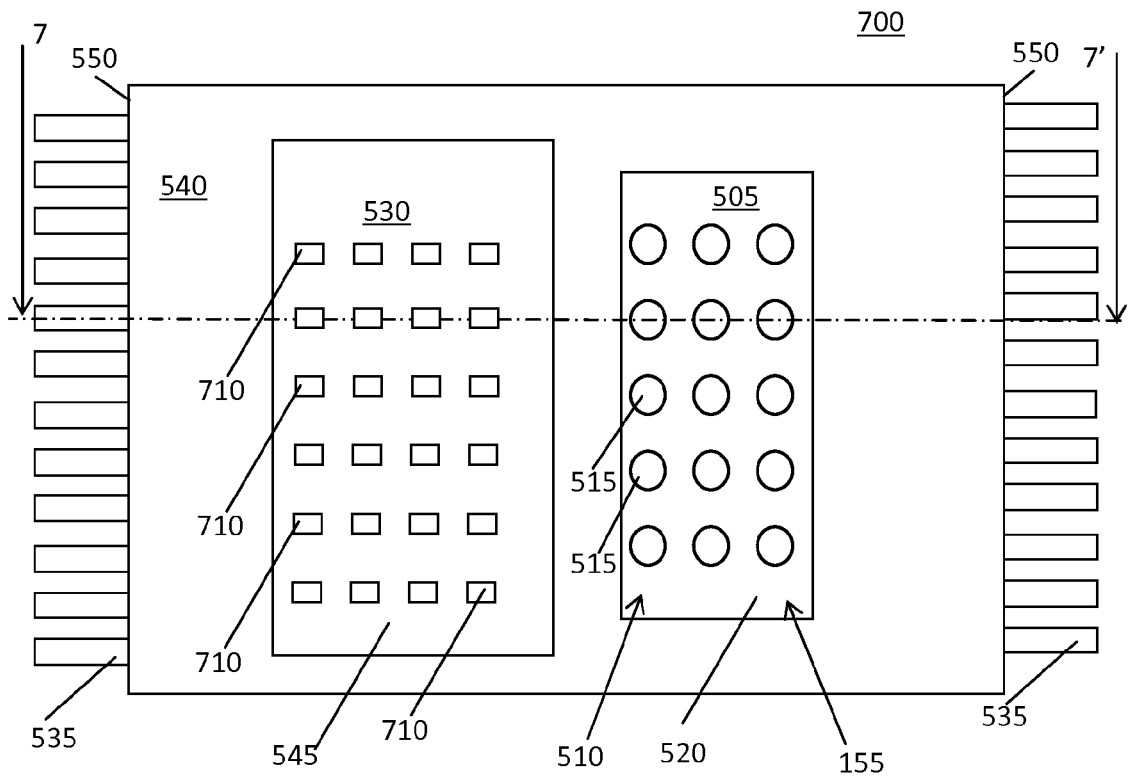
FIG. 7 is a bottom plan view of a dual die semiconductor package in accordance with yet another embodiment of the present invention.
Figure 8:
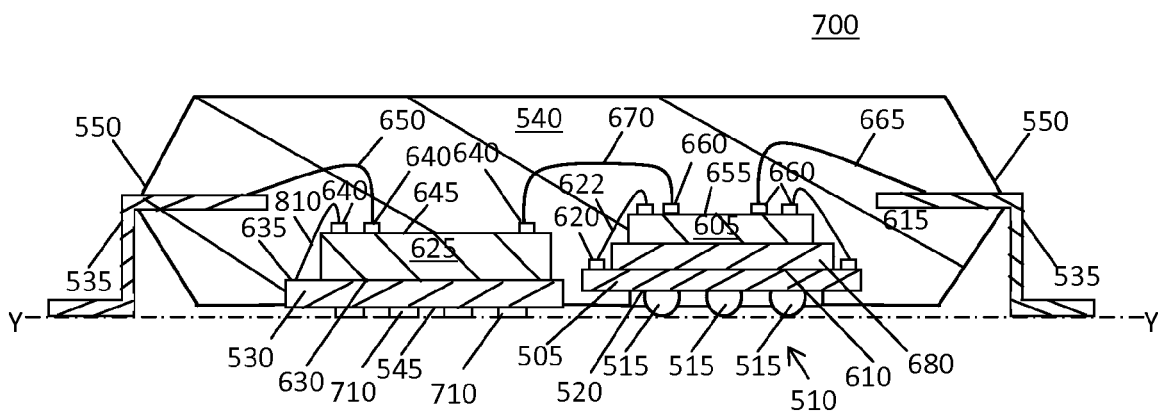
FIG. 8 is a cross-sectional side view through 7-7' of the dual die semiconductor package of FIG. 7.

Referring to FIG. 7 and FIG. 8 there is illustrated a dual die semiconductor package 700 in accordance with a yet another embodiment of the present invention. To avoid repetition, since most of the elements or components of the dual die semiconductor package 700 are the same as that of the dual die semiconductor package 500, only the differences will be described. In this embodiment some of the second die upper surface external electrical connection pads 640 are electrically connected to the lead frame flag 530. The electrical connection of the second die upper surface external electrical connection pads 640 to the lead frame flag 530 is provided by bonded wires 810. There are electrical contacts 710 soldered on the base surface 545 of the lead frame flag 530, these electrical contacts 310 are aligned in the seating plane Y and provide ground plane connections to the dual die semiconductor package 700.

Advantageously, the present invention provides a heat sink in the form the exposed lead frame flag. The lead frame flag can also be used to provide ground plane connections to the dual die semiconductor package. As a result, the leads, grid array and the exposed lead frame flag can provide both heat dissipation, ground plane connections and sufficient external connections for semiconductor packages that have semiconductor dies with high processing power.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A dual die semiconductor package, comprising:
a substrate with a grid array of electrical contacts on a bottom surface thereof;
a first semiconductor die with a base surface mounted to an upper surface of the substrate, the first semiconductor die having a plurality of first die upper surface external electrical connection pads on an upper surface thereof that are electrically connected to respective ones of said electrical contacts of the grid array;
a lead frame including a flag and a plurality of leads;
a second semiconductor die with a base surface mounted to an upper surface of the lead frame flag, the second semiconductor die having second die upper surface external electrical connection pads on an upper surface thereof;
wherein at least one of the leads of the plurality of leads is electrically connected to at least one of said second die upper surface external electrical connection pads;
wherein the substrate is mounted to the lead frame flag, and the lead frame flag has a slot therein for allowing the electrical contacts of the grid array to pass therethrough; and
a package body at least partially enclosing the first semiconductor die and the second semiconductor die, wherein the electrical contacts of the grid array and part of each of the leads protrude from the package body to form external package electrical connections, and wherein at least part of a base surface of the lead frame flag is left exposed by the package body.

2. The dual die semiconductor package of claim 1, wherein the part of each of the leads that protrudes from the package body forms a seating plane.

3. The dual die semiconductor package of claim 2, wherein the electrical contacts of the grid array are aligned in the seating plane.

4. The dual die semiconductor package of claim 1, wherein the part of each of the leads that protrudes from the package body extends from edges of the package body.

5. The dual die semiconductor package of claim 1, wherein the grid array is a ball grid array.

6. The dual die semiconductor package of claim 1, wherein at least part of the grid array is aligned directly under the first semiconductor die.

7. The dual die semiconductor package of claim 1, wherein at least one of the first die upper surface external electrical connection pads is electrically connected to at least one of the leads.

8. The dual die semiconductor package of claim 7, wherein the at least one of the first die upper surface external electrical connection pads is electrically connected to at least one of said second die upper surface external electrical connection pads.

9. The dual die semiconductor package of claim 1, wherein at least one of the second die upper surface external electrical connection pads is electrically connected to the lead frame flag.

10. The dual die semiconductor package of claim 9, further comprising electrical contacts on the base surface of the lead frame flag.

11. The dual die semiconductor package of claim 10, wherein the electrical contacts on the base surface of the lead frame flag are aligned in the seating plane.

* * * * *